(12) United States Patent
Senoo et al.

(10) Patent No.: US 7,408,259 B2
(45) Date of Patent: Aug. 5, 2008

(54) SHEET TO FORM A PROTECTIVE FILM FOR CHIPS

(75) Inventors: Hideo Senoo, Kawaguchi (JP); Takashi Sugino, Kawaguchi (JP); Osamu Yamazaki, Saitama (JP)

(73) Assignee: Lintec Corporation, Tokyo (JP)

( * ) Notice: Subject to any disclaimer, the term of this patent is extended or adjusted under 35 U.S.C. 154(b) by 0 days.

(21) Appl. No.: 11/113,480

(22) Filed: Apr. 25, 2005

(65) Prior Publication Data

US 2005/0184402 A1    Aug. 25, 2005

Related U.S. Application Data

(62) Division of application No. 10/102,583, filed on Mar. 20, 2002, now Pat. No. 6,919,262.

(30) Foreign Application Priority Data

Mar. 21, 2001   (JP)   ............................. 2001-81226

(51) Int. Cl.
   *H01L 23/12*   (2006.01)
   *H01L 23/053*  (2006.01)

(52) U.S. Cl. ............... 257/701; 257/729; 257/730; 257/793; 257/E23.002; 257/E23.114

(58) Field of Classification Search ............... 257/701
   See application file for complete search history.

(56) References Cited

U.S. PATENT DOCUMENTS

| 4,756,968 A | 7/1988 | Ebe et al. |
| 4,793,883 A | 12/1988 | Sheyon et al. |
| 5,110,388 A | 5/1992 | Komiyama et al. |
| 6,007,920 A | 12/1999 | Umehara et al. |
| 6,023,094 A * | 2/2000 | Kao et al. .................. 257/632 |
| 6,245,382 B1 | 6/2001 | Shvartsman et al. |
| 6,297,131 B1 | 10/2001 | Yamada et al. |

FOREIGN PATENT DOCUMENTS

| EP | 0 157 508 A2 | 10/1985 |
| EP | 0 359 373 A2 | 3/1990 |
| JP | 60-223139 A | 11/1985 |
| JP | 8-239636 A | 9/1996 |
| JP | 10-335271 A | 12/1998 |
| WO | WO 00/50250 A1 | 8/2000 |

* cited by examiner

*Primary Examiner*—David A Zarneke
(74) *Attorney, Agent, or Firm*—The Webb Law Firm, P.C.

(57) ABSTRACT

A sheet to form a protective film for chips includes a release sheet and a protective film forming layer formed on a detachable surface of the release sheet. The protective film forming layer includes a thermosetting and/or energy ray-curable component and a binder polymer component.

5 Claims, 7 Drawing Sheets

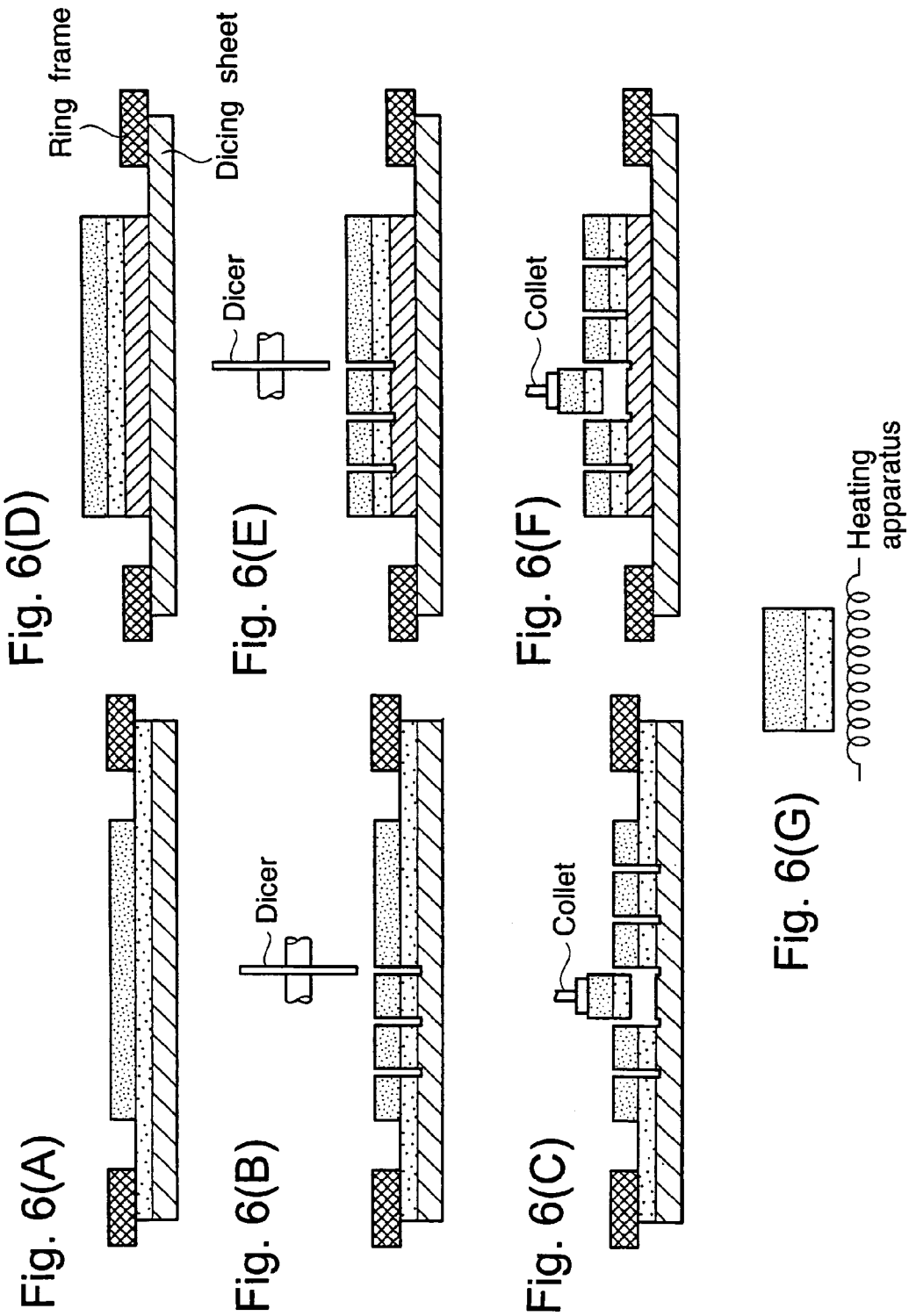

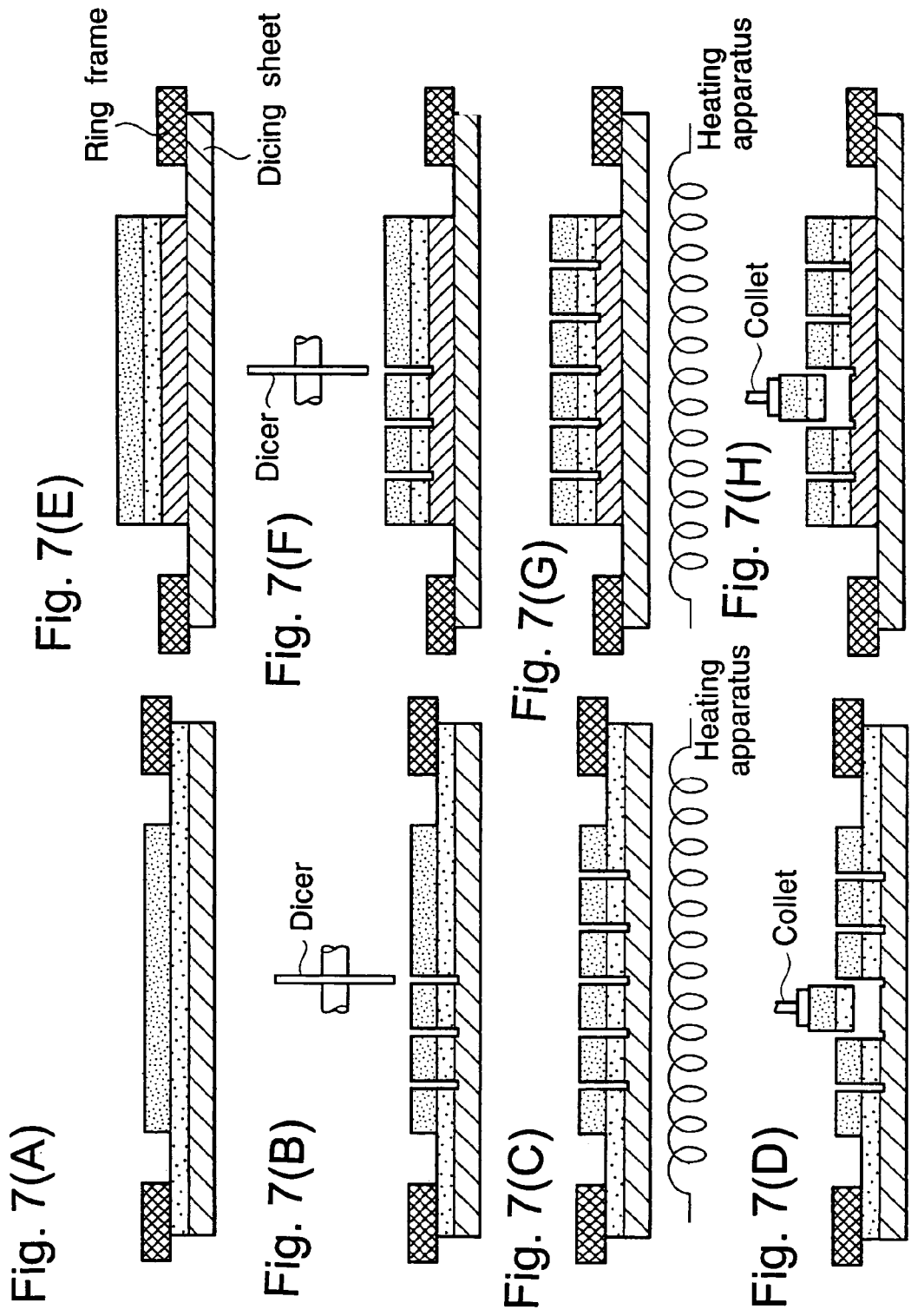

SHEET TO FORM A PROTECTIVE FILM FOR CHIPS

CROSS-REFERENCE TO RELATED APPLICATIONS

This application is a division of U.S. patent application Ser. No. 10/102,583 filed Mar. 20, 2002 now U.S. Pat No. 6,919,262, and also relates to U.S. Patent Application entitled "Process for Producing Semiconductor Chips" filed concurrently herewith as a further division of U.S. patent application Ser. No. 10/102,583, both of which are incorporated herein by reference in their entirety.

BACKGROUND OF THE INVENTION

1. Field of the Invention

The present invention relates to a sheet to form a protective film for chips, which enables to efficiently form a protective film on a back surface of a semiconductor chip, and thereby contributes to improvement in production efficiency of chips. More particularly, the present invention relates to a sheet to form a protective film for chips, which is used in production of semiconductor chips by face down mounting process.

The present invention also relates to a process for producing semiconductor chips, using the sheet to form a protective film for chips.

2. Description of the Prior Art

Recently, production of semiconductor devices is made through a so-called face down mounting process. In the face down process, chips are electrically connected with a substrate through a convex portion (bump) formed on a circuit surface of the chip to ensure its conductivity to the substrate.

Semiconductor devices are generally produced though the following steps:

(1) forming a circuit on a surface of a semiconductor wafer by etching or the like and providing a bump on the appointed position of the circuit surface;

(2) grinding the back surface of semiconductor wafer to have a given thickness;

(3) fixing the back surface of semiconductor wafer onto a dicing sheet which is tautly supported by a ring frame, and dicing the wafer to separate each circuit by the use of a dicing saw to obtain semiconductor chips; and (4) picking up the semiconductor chips to mount them face down on a prescribed substrate and sealing the chip in a resin or coating the back surface of chip with a resin according to necessity for chip protection, thereby obtaining a semiconductor device.

The resin sealing is performed by dripping resin in a proper amount on the chip (potting method) or using a mold (molding method), both followed by curing. The potting method has a drawback of difficulty in dripping a proper amount of resin. The molding method involves washing of the mold, which will require additional costs for equipment and operation thereof.

The resin coating may cause ununiform quality because of the difficulty in spreading a proper amount of resin evenly on the chips.

Therefore, the technique which is capable of forming a highly uniform protective film on a back surface of chip by simplified operation, has been desired.

In the grinding of the back surface of the wafer in step (2), minute streaky scratches are formed on the back surface of the chip owing to the use of a grinding machine. The minute scratches may cause cracks during the dicing in step (3) or after the device is packaged. As such, it has been conventionally required in some cases to perform chemical etching after the mechanical grinding to eliminate the minute scratches. The chemical etching, as a matter of course, raises problems related to the cost increase for its equipment and operation.

Therefore, the technique for prevailing adverse effects resulting from minute scratches has been desired, even if minute scratches are left on the back surface of wafer as a result of mechanical grinding.

In light of the above prior art, it is an object of the present invention to provide a process through which a highly uniform protective film can be readily formed on a back surface of chip, and, even if minute scratches are formed on the back surface of chip as a result of mechanical grinding, the chip is prevailed over adverse effects resulting from the scratches. It is another object of the invention to provide a sheet to form a protective film for chips employable in the above process.

SUMMARY OF THE INVENTION

A first sheet to form a protective film for chips according to the present invention comprises a release sheet and a protective film forming layer formed on a detachable surface of the release sheet, wherein said protective film forming layer comprises a thermosetting or energy ray-curable component and a binder polymer component.

A second sheet to form a protective film for chips according to the present invention comprises a release sheet and a protective film forming layer formed on a detachable surface of the release sheet, wherein said protective film forming layer comprises a thermosetting component, an energy ray-curable component and a binder polymer component.

In the invention, the binder polymer component, the thermosetting component and the energy ray-curable component are preferably composed of an acrylic polymer, an epoxy resin and an ultraviolet ray-curable resin, respectively.

When the sheet to form a protective film for chips is employed in the process of the invention (mentioned later), a highly uniform protective film can be readily formed on a back surface of chip and, even if minute scratches are formed on the back surface of chip as a result of mechanical grinding, the chip is prevailed over adverse effects resulting from the scratches.

The first process for producing semiconductor chips having a protective film on the back surface comprises;

adhering a protective film forming layer of the first or second sheet to form a protective film for chips according to the present invention onto a back surface of a semiconductor wafer having circuits on its surface, and thereafter, further conducting the following steps 1 to 3 in an arbitrary order:

Step 1: detaching the release sheet from the protective film forming layer;

Step 2: curing the protective film forming layer by heating or energy ray irradiation;

Step 3: dicing the semiconductor wafer together with the protective film forming layer with respect to each circuit.

The second process for producing semiconductor chips having a protective film on the back surface comprises;

adhering a protective film forming layer of the second sheet to form a protective film for chips according to the present invention onto a back surface of a semiconductor wafer having circuits on its surface, curing the protective film forming layer by irradiation with energy ray, and thereafter, further conducting the following steps 1 to 3 in an arbitrary order:

Step 1: detaching the release sheet from the protective film forming layer;

Step 2: further curing the protective film forming layer by heating;

Step 3: dicing the semiconductor wafer together with the protective film forming layer with respect to each circuit.

BRIEF DESCRIPTION OF THE DRAWINGS

FIGS. 2 to 7 are flow sheets of processes for producing semiconductor chips of the present invention.

1 is a release sheet.
2 is a protective film forming layer.
3 is a semiconductor wafer.
10 is a sheet to form a protective film for chips.

DETAILED DESCRIPTION OF THE INVENTION

The present invention will be described in detail with reference to the drawings.

Figure 1:
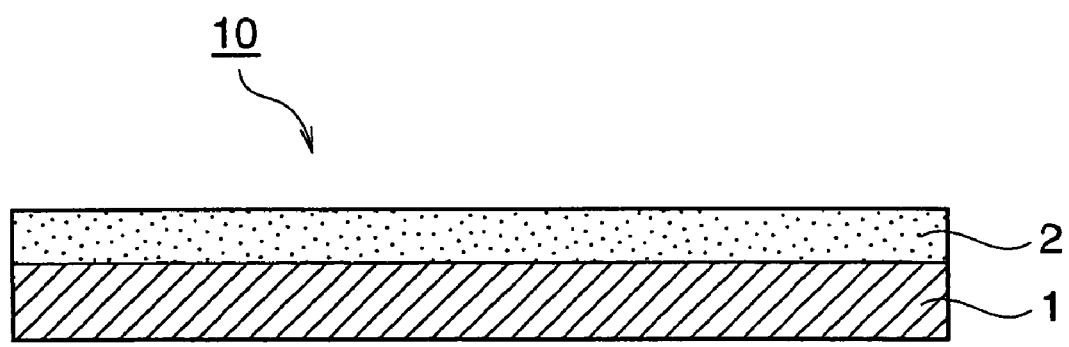
FIG. 1 is a section view of the sheet to form a protective film for chips of the present invention.
Figure 2A:
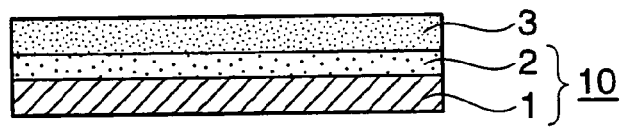
Figure 2B:
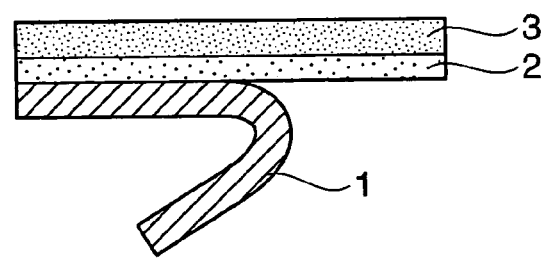
Figure 2C:
Figure 2D:
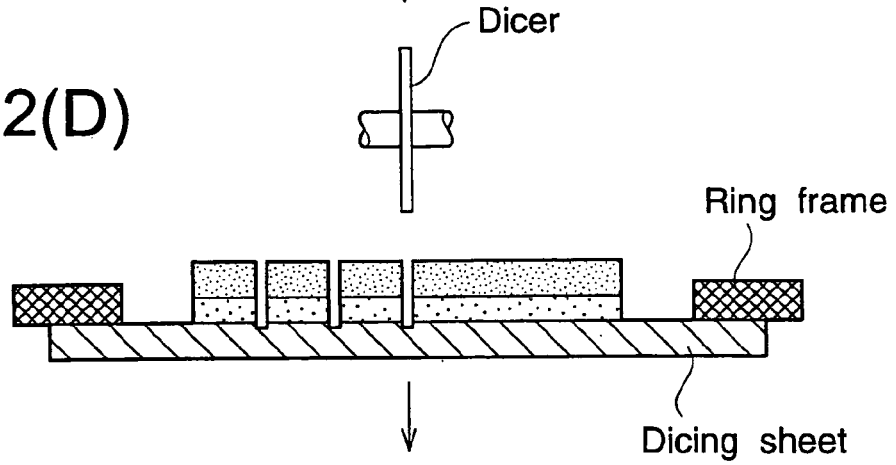
Figure 2E:
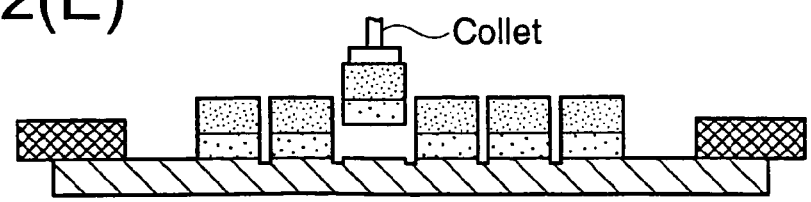
Figure 3A:
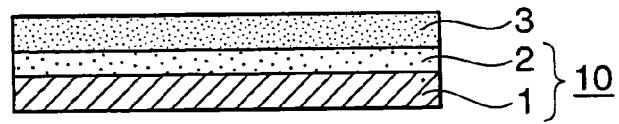
Figure 3B:
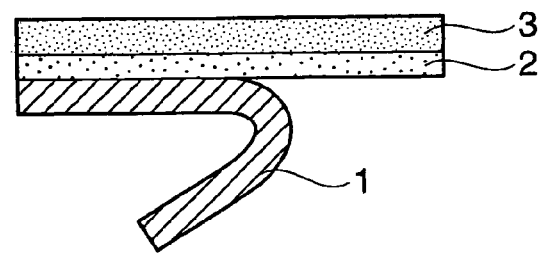
Figure 3C:
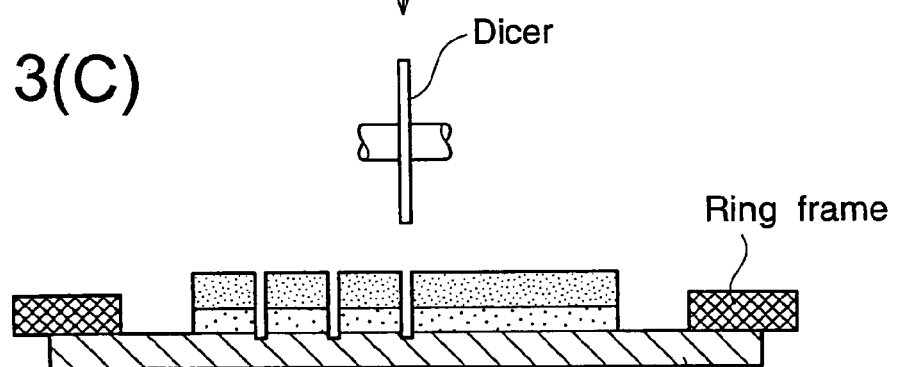
Figure 3D:
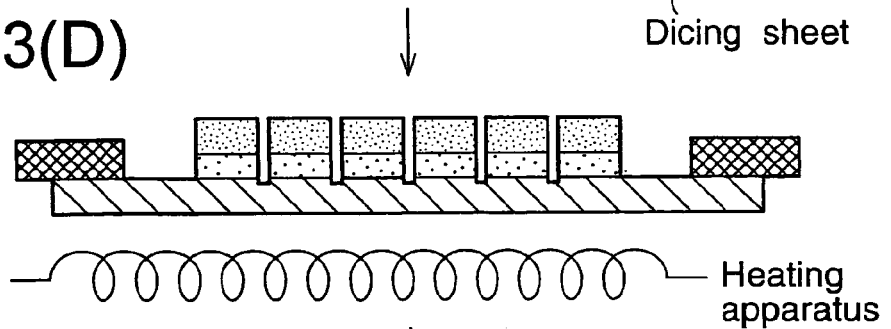
Figure 3E:
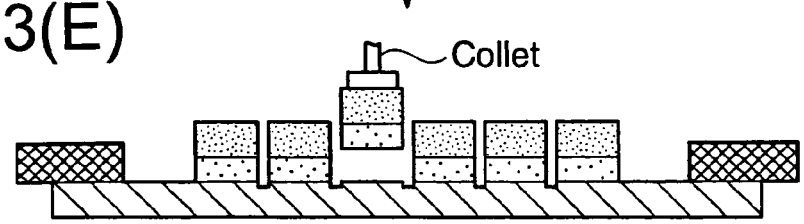
Figure 4A:
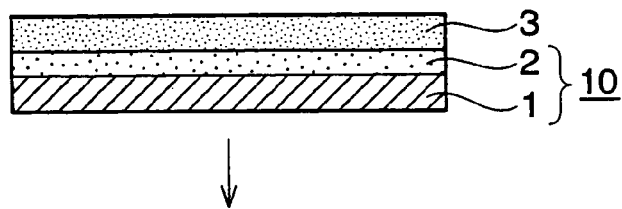
Figure 4B:
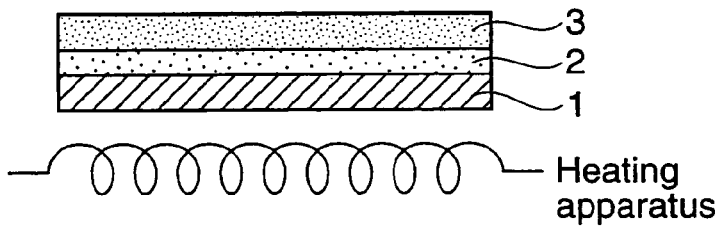
Figure 4C:
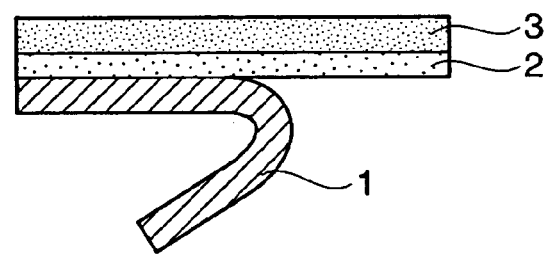
Figure 4D:
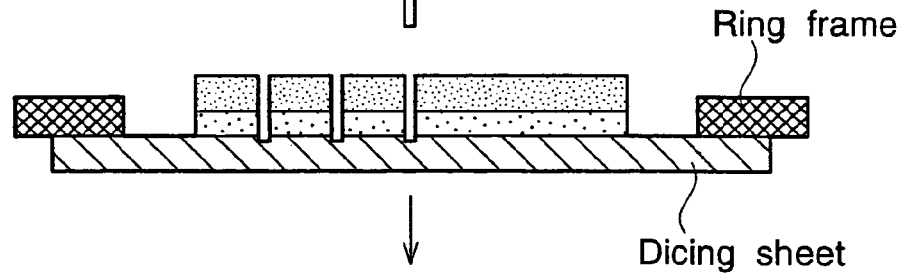
Figure 4E:
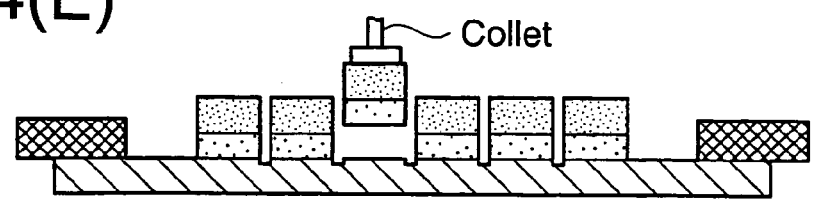
Figure 5A:
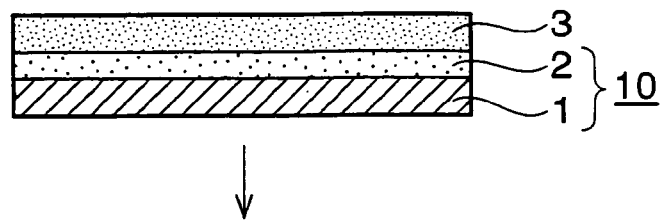
Figure 5B:
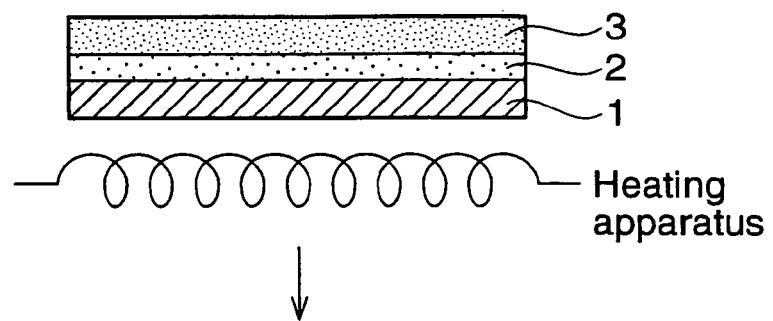
Figure 5C:
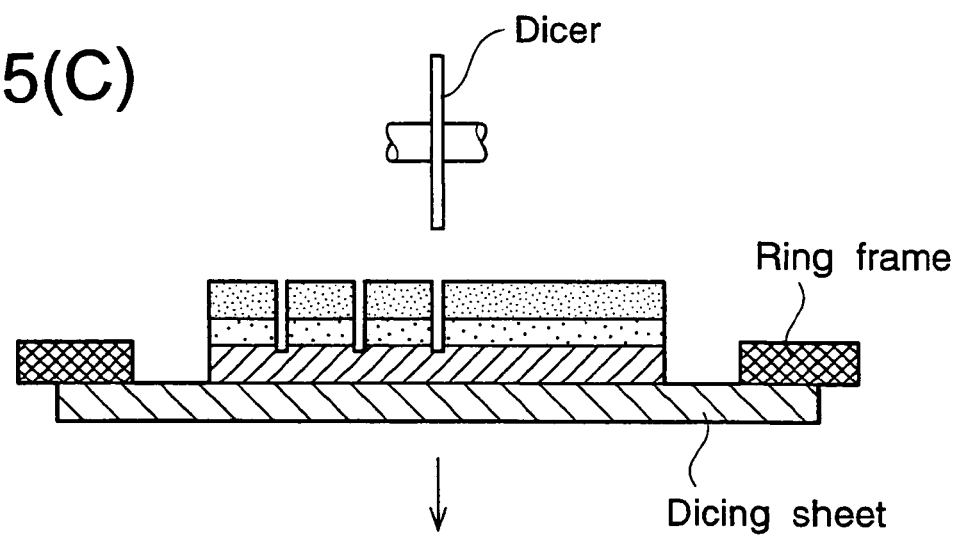
Figure 5D:
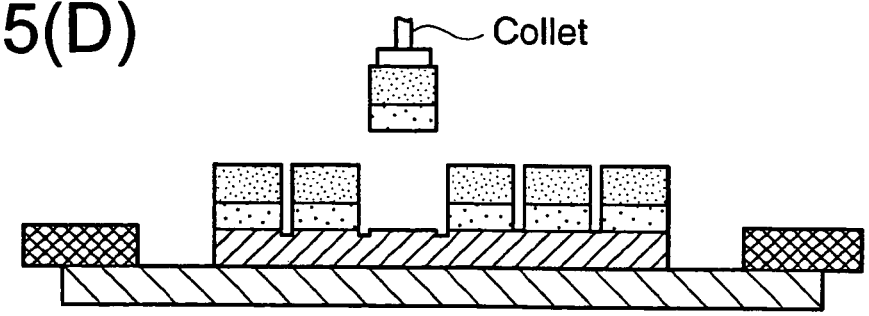

The first sheet 10 to form a protective film for chips of the invention comprises, as shown in FIG. 1, the release sheet 1 and the protective film forming layer 2 formed on the a detachable surface of the release sheet 1.

The release sheet 1 can be composed of a film of, e.g., polyethylene, polypropylene, polybutene, polybutadiene, polymethylpentene, polyvinyl chloride, vinyl chloride copolymer, polyethylene terephthalate, polyethylene naphthalate, polybutylene terephthalate, polyurethane, ethylene-vinyl acetate, ionomer-resin, ethylene/(meth)acrylic acid copolymer, ethylene/(meth)acrylate copolymer, polystyrene, polycarbonate, polyimide, and fluorine resin. A film of a crosslinked product of the above polymers, or a laminated film of the above films can be used as well.

When the release sheet is detached after the curing of the protective film forming layer, films of polymethylpentene, polyethylene naphthalate and polyimide are particularly preferable for their excellent heat resistance.

The release sheet 1 has a surface tension of 40 mN/m or less, preferably 37 mN/m or less, highly preferably 35 mN/m or less. The low surface tension of the release sheet 1 can be attained by appropriately selecting the sheet material or coating a silicone resin on the surface of sheet 1 for release treatment.

The release sheet 1 has a thickness of generally 5 to 300 µm, preferably 10 to 200 µm, particularly preferably 20 to 150 µm.

The protective film forming layer 2 of the first sheet to form a protective film for chips is composed of a thermosetting or energy ray-curable component and a binder polymer component.

The protective film forming layer 2 of the second sheet to form a protective film for chips is composed of a thermosetting component, an energy ray-curable component and a binder polymer component.

Examples of the thermosetting component include epoxy resin, phenol resin, melamine resin, urea resin, polyester resin, urethane resin, acrylic resin, polyimide resin, benzoxazine resin and mixtures thereof. In the invention, epoxy resin, phenol resin and a mixture thereof are preferably employed.

The epoxy resin can make a rigid coat with three dimensional network when heated. Various known epoxy resins have been conventionally used. Preferably, the epoxy resin has a molecular weight of around 300 to 2000. Particularly preferred is a blend of epoxy resins containing a liquid one in ordinary state, having a molecular weight of 300 to 500, preferably 330 to 400 and the solid one at ordinary temperature, having a molecular weight of 400 to 2500, preferably 500 to 2000. The epoxy resin preferably used in the invention has an epoxy equivalent of 50 to 5000 g/eq. Examples for such epoxy resin include glycidyl ethers of phenol, e.g., bisphenol A, bisphenol F, resorcinol, phenol novolak and cresol novolak; glycidyl ethers of alcohol, e.g., butanediol, polyethylene glycol and polypropylene glycol; glycidyl ethers of carboxylic acid, e.g., phthalic acid, isophthalic acid and tetrahydrophthalic acid; epoxy resins of the glycidyl- or alkyl glycidyl-type, e.g., those of aniline isocyanurate in which active hydrogen bonded to nitrogen is substituted with a glycidyl group; and so-called alicyclic epoxies in which epoxy is introduced by oxidation of C-C double bond in the molecule, e.g., vinylcyclohexane diepoxide, 3,4-epoxycyclohexylmethyl-3,4-dicyclohexane carboxylate and 2-(3,4-epoxy)cyclohexyl-5,5-spiro(3,4-epoxy)cyclohexane-m-dioxane. Epoxy resins having a biphenyl, dicyclohexadiene or naphthalene skeleton can be also employed.

Of these, epoxy resins of bisphenol-based glycidyl type, o-cresol novolak type or phenol novolak type are preferable for the invention. These epoxy resins are used either individually or in combination.

The epoxy resin, when employed, is used together with an assistant additive, i.e., a heat-activatable latent epoxy resin curing agent, preferably.

The heat-activatable latent epoxy resin curing agent does not react with an epoxy resin at room temperature but does react when activated under heating over a specific temperature.

To activate the heat-activatable latent epoxy resin curing agent, use can be made of a method in which active species (anions, cations) are generated through the chemical reaction by heating, a method in which the agent, which has been stably dispersed in the epoxy resin at around room temperature, is incorporated with the resin to dissolve therein at high temperatures to initiate the curing reaction, a method in which the curing agent encapsulated in molecular sieve is eluted at high temperatures to initiate the curing reaction, and a method using a micro-capsule.

Examples of the heat-activatable latent epoxy resin curing agent for use in the invention include various onium salts and active hydrogen compounds of high melting point, e.g., dibasic acid dihydrazide compound, dicyandiamide, amine adduct curing agent and imidazole compound.

These heat-activatable latent epoxy resin curing agents can be used either individually or in combination. The heat-activatable latent epoxy resin curing agent is used at 0.1 to 20 parts, preferably 0.2 to 10 parts, highly preferably 0.3 to 5 parts by weight per 100 parts by weight of the epoxy resin.

Condensation products of aldehydes and phenols, e.g., alkylphenol, polyphenol and naphthol, can be used as the phenol resin without limitations. Examples of the phenol resin preferably used in the invention include phenol novolak, o-cresol novolak, p-cresol novolak, t-butyl phenol novolak, dicyclopentadiene cresol, poly paravinyl phenol and bisphenol A novolak resins, and modified resins thereof.

The phenolic hydroxyl group contained in the phenol resin can readily occur addition reaction with an epoxy group in the epoxy resin when heated to form a cured product high in impact resistance. Accordingly, the epoxy resin and the phenol resin can be used together.

The energy ray-curable component is composed of a compound polymerizable/curable by irradiation of an energy ray, e.g., ultraviolet ray and electron ray. The compound has at least one polymerizable double bond in the molecule, and generally has a molecular weight of around 100 to 30000, preferably around 300 to 10000. Exemplary compounds polymerizable by energy ray irradiation include low molecular weight compounds disclosed in Japanese Patent Laid-Open Publication Nos. 60(1985)/196956 and 60(1985)/223139. Specifically, examples include trimethylolpropane triacrylate, tetramethylolmethane tetraacrylate, pentaerythritol triacrylate, dipentaerythritol monohydroxypentaacrylate, dipentaerythritol hexaacrylate, 1,4-butyleneglycoldiacrylate, 1,6-hexanedioldiacrylate, polyethyleneglycoldiacrylate, oligoesteracrylate, a urethaneacrylate oligomer of polyester or polyether type, polyesteracrylate, polyetheracrylate, and epoxy-modified acrylate.

Of these, preferable for the present invention are ultraviolet ray-curable resins, specifically oligoesteracrylate and a urethaneacrylate oligomer.

Incorporation of a photopolymerization initiator in the energy ray-curable component can shorten the polymerization/curing time and reduce the ray irradiation dose.

Examples of the photopolymerization initiator include benzophenone, acetophenone, benzoin, benzoin methyl ether, benzoin ethyl ether, benzoin isopropyl ether, benzoin isobutyl ether, benzoin benzoic acid, benzoin methyl benzoate, benzoin dimethyl ketal, 2,4-diethylthioxanthone, α-hydroxycyclohexylphenylketone, benzyldiphenylsulfide, tetramethylthiurammonosulfide, azobisisobutyronitrile, benzyl, dibenzyl, diacetyl, and β-chloroanthraquinone.

The photopolymerization initiator is suitably used at 1.5 to 4.5 parts by weight, preferably 2.4 to 3.8 parts by weight per 100 parts by weight of the energy ray-curable component.

The binder polymer component is employed for the purposes of imparting proper tackiness to the protective film forming layer 2 and improving operability of the sheet.

The binder polymer has a weight-average molecular weight of 50,000 to 2,000,000, preferably 100,000 to 1,500,000, particularly preferably 200,000 to 1,000,000. The sheet might not be formed adequately when the molecular weight of the binder polymer is too low, and not uniformly when too high because of poor mutual solubility of the polymer with other components.

Usable binder polymers are, for example, acrylic polymers, polyester resin, urethane resin, silicone resin and rubber polymers. Acrylic polymers are preferable.

Examples of the acrylic polymers include (meth)acrylate copolymers comprising constituent units derived from a (meth)acrylate monomer and those derived from a (meth)acrylic acid derivative. Preferably, the (meth)acrylate monomer is $C_{1-18}$ alkyl (meth)acrylate, e.g., methyl (meth)acrylate, ethyl (meth)acrylate, propyl (meth)acrylate and butyl (meth)acrylate. Exemplary (meth)acrylic acid derivatives are (meth)acrylic acid, glycidyl (meth)acrylate and hydroxyethyl (meth)acrylate.

A glycidyl group may be introduced into the acrylic polymer chain by copolymerization of glycidyl (meth)acrylate, thereby improving mutual solubility of the polymer with an epoxy resin working as a thermosetting adhesive component (mentioned later). The copolymerization also increases Tg of the cured product, thereby improving the heat resistance. Introducing a hydroxyl group into the acrylic polymer using, for example, hydroxyethyl acrylate facilitates controlling the adhesion toward a chip and adhesion characteristics of the polymer.

The acrylic polymer has a weight average molecular weight of preferably 100,000 or more, more preferably 150,000 to 1,000,000. The glass transition temperature thereof is usually 20° C. or below, preferably around −70 to 0° C. The polymer has tackiness at ordinary temperature (23° C.)

Referring to the first sheet to form a protective film for chips, when the thermosetting component alone is incorporated in the protective film forming layer 2, it is incorporated at usually 100 to 1500 parts, preferably 150 to 1000 parts, more preferably 200 to 800 parts by weight per 100 parts by weight of the binder polymer component. When the energy ray-curable component alone is incorporated in the protective film forming layer 2, it is incorporated at 5 to 500 parts, preferably 10 to 200 parts, more preferably 20 to 150 parts by weight per 100 parts by weight of the binder polymer component.

Referring to the second sheet to form a protective film for chips, the thermosetting component and the energy ray-curable component are incorporated in the protective film forming layer 2 at 100 to 1500 parts, preferably 150 to 1000 parts, more preferably 200 to 800 parts by weight in total per 100 parts by weight of the binder polymer component. At the same time, the weight ratio of the thermosetting component to the energy ray-curable component (thermosetting component/energy ray-curable component) is preferably 55/45, to 97/3, more preferably 60/40 to 95/5, particularly preferably 70/30 to 90/10.

Incorporation of the thermosetting component and the energy ray-curable component with the binder polymer component in the above weight ratio gives a protective film which has proper tackiness before curing to allow secure application and exhibits excellent film hardness after curing.

The protective film forming layer 2 can be colored. Coloration for the protective film forming layer 2 can be made by incorporating a pigment or a dye therein. The colored protective film forming layer 2 improves appearance of the resulting chips.

The protective film forming layer 2 may contain various additives in addition to the above components. For example, electrically conductive fillers, e.g., gold, silver, copper, nickel, aluminum, stainless steel, carbon, ceramic, silver-coated nickel and silver-coated aluminum are added for the purpose of imparting electrical conductivity after die bonding. Thermal conductive substances, such as metallic materials, e.g., gold, silver, copper, nickel, aluminum, stainless steel, silicon and germanium, and alloys thereof, are added for the purpose of imparting thermal conductivity.

A coupling agent may be added in the protective film forming layer 2 to improve adhesive properties and adhesion between the back surface of chip and the cured protective film. The coupling agent improves adhesive properties, adhesion and water resistance (moist heat resistance) of the protective film without deteriorating its heat resistance.

A preferable coupling agent is of silane type (silane coupling agent) in view of versatility and costwise merits.

The protective film forming layer 2 may contain a crosslinking agent, e.g., organic polyvalent isocyanate compound, organic polyvalent imine compound and organometallic chelate compound, to adjust its initial adhesive and cohesive forces before cure.

An antistatic agent may be incorporated in the protective film forming layer 2. Incorporation thereof inhibits static electricity occurrence to improve the chip reliability.

A phosphoric acid, bromo or phosphorus compound can be incorporated in the protective film forming layer 2 to impart flame resistance. Such a film has improved reliability as a manufactured IC package.

The sheet 10 to form a protective film for chips is produced by coating the composition comprising the above components directly on a detachable surface of the release sheet 1 using a conventional coater, e.g., a roll knife coater, a gravure coater, a die coater and a reverse coater, or by transferring said composition on a detachable surface of the release sheet 1, and drying the composition to form the protective film forming layer 2. The composition can be coated on the detachable surface of the release sheet in a state dissolved or dispersed in a solvent according to necessity.

The protective film forming layer 2 thus formed has a thickness of usually 3 to 100 µm, preferably 10 to 60 µm.

The second sheet to form a protective film for chips of the present invention has common features, preferable embodiments inclusive, with the first sheet to form a protective film for chips, except that the former sheet has the protective film forming layer composed essentially of both thermosetting and energy ray-curable components.

The first or second sheet 10 to form a protective film for chips, when employed in the process for producing semiconductor devices (mentioned later), can readily make a highly uniform protective film on a back surface of chip. Moreover, even if minute scratches are formed on the back surface of chip as a result of mechanical grinding, the chip is prevailed over adverse effects resulting from the scratches.

The first process for producing semiconductor chips of the present invention will be described with reference to the drawings.

The first process for producing semiconductor chips having a protective film on the back surface comprises:

adhering a protective film forming layer of the first or second sheet to form a protective film for chips according to the present invention onto a back surface of a semiconductor wafer having circuits on its surface, and thereafter, further conducting the following steps 1 to 3 in an arbitrary order:

Step 1: detaching the release sheet from the protective film forming layer;

Step 2: curing the protective film forming layer by heating or energy ray irradiation;

Step 3: dicing the semiconductor wafer together with the protective film forming layer with respect to each circuit.

The process wherein the steps 1, 2 and 3 are conducted in this order (hereinafter, referred to as 1-2-3 mode production process) is first described with reference to FIG. 2.

The protective film forming layer 2 of the sheet 10 to form a protective film for chips is applied onto a back surface of the semiconductor wafer 3 having circuits on its surface (FIG. 2-A).

The release sheet 1 is detached from the protective film forming layer 2, as shown in FIG. 2-B, to obtain a laminate composed of the semiconductor wafer 3 and the protective film forming layer 2.

Then, the protective film forming layer 2 is cured by heating or energy ray irradiation to form a protective film covering all the back surface of the wafer. FIG. 2-C illustrates the feature wherein the protective film forming layer 2 is heated using a heating apparatus. The wafer with the protective film has higher strength compared with the naked one, thereby decreasing breakage of the wafer during operation. Even if minute scratches are formed on the back surface of wafer as a result of grinding, the protective film fills in the scratches, thereby prevailing the wafer over adverse effects resulting from the scratches.

The protective film of the invention is excellent in thickness uniformity and the yield of its materials in comparison with protective films produced by spreading a coating liquid directly on a back surface of wafer or chip to make a protective film.

Next, as shown in FIG. 2-D, the laminate composed of the semiconductor wafer 3 and the protective film 2 is diced with respect to each circuit formed on the wafer surface. The dicing is performed so as to cut both of the wafer and the protective film. The wafer dicing is performed by the conventional method using a dicing sheet. As a result, semiconductor chips having a protective film on its back surface are obtained.

Finally, diced chips are picked up by the use of general means, e.g., collets, thereby semiconductor chips having a protective film on its back surface are obtained (FIG. 2-E).

According to the invention, a highly uniform protective film can be readily formed on a back surface of chip, and even if minute scratches are formed on the back surface of chip as a result of mechanical grinding, the protective film fills in the scratches, thereby reducing the occurrence of cracks during dicing step or in the finally packaged device.

The process wherein the steps 1, 3 and 2 are conducted in this order is described in detail below with reference to FIG. 3.

The 1-3-2 mode production process comprises the steps of:

applying the protective film forming layer 2 of the sheet 10 to form a protective film for chips onto the back surface of the semiconductor wafer 3 having circuits on its surface (FIG. 3-A);

detaching the release sheet 1 from the protective film forming layer 2 (FIG. 3-B);

dicing the semiconductor wafer 3 together with the protective film 2 with respect to each circuit (FIG. 3-C); and curing the protective film forming layer 2 by heating or energy ray irradiation (FIG. 3-D) to obtain semiconductor chips having the protective film 2 on its back surface (FIG. 3-E).

That is, the 1-3-2 mode production process is identical to the 1-2-3 mode production process (FIG. 2), except that the protective film forming layer 2 is cured after the dicing.

When the protective film forming layer 2 contains the thermosetting component, the curing thereof is conducted by heating. Therefore, the dicing sheet is required to have sufficient heat resistance to avoid heat deterioration at the time of curing.

The process wherein the steps 2, 1 and 3 are conducted in this order is described in detail with reference to FIG. 4.

The 2-1-3 mode production process comprises the steps of:

applying the protective film forming layer 2 of the sheet 10 to form a protective film for chips onto the back surface of the semiconductor wafer 3 having circuits on its surface (FIG. 4-A);

curing the protective film forming layer 2 by heating or energy ray irradiation (FIG. 4-B);

detaching the release sheet 1 from the cured protective film forming layer 2 (FIG. 4-C); and dicing the semiconductor wafer 3 together with the protective film 2 with respect to each circuit (FIG. 4-D) to obtain semiconductor chips having the protective film 2 on its back surface (FIG. 4-E).

That is, the 2-1-3 mode production process is identical to the 1-2-3 mode production process, except that the release sheet 1 is detached after the protective film forming layer 2 is cured.

When the protective film forming layer 2 contains the thermosetting component, the curing thereof is conducted by heating. Therefore, the release sheet 1 is required to have sufficient heat resistance to avoid heat deterioration at the time of curing. Hence, films of, e.g., polymethylpentene, polyethylene naphthalate and polyimide, are employed as the release sheet 1 because of their excellent heat resistance.

The process wherein the steps 2, 3 and 1 are conducted in this order is described in detail with reference to FIG. 5.

The 2-3-1 mode production process comprises the steps of:

applying the protective film forming layer 2 of the sheet 10 to form a protective film for chips onto the back surface of the semiconductor wafer 3 having circuits on its surface (FIG. 5-A); curing the protective film forming layer 2 by heating or energy ray irradiation (FIG. 5-B);

dicing the semiconductor wafer 3 together with the cured protective film forming layer 2 with respect to each circuit (FIG. 5-C); and detaching the release sheet 1 from the cured protective film forming layer 2 (FIG. 5-D) to obtain semiconductor chips having the protective film 2 on its back surface.

In this mode, the detaching of the release sheet 1 synchronizes with the picking-up of the chip. In other words, by picking up the chip, the chip is detached from the release sheet to give a semiconductor chip having the protective film on its back surface.

When the protective film forming layer 2 contains the thermosetting component, the curing thereof is conducted by heating. Therefore, the release sheet 1 is required to have sufficient heat resistance to avoid heat deterioration at the time of curing. Hence, films of, e.g., polymethylpentene, polyethylene naphthalate and polyimide, are employed as the release sheet 1 because of their excellent heat resistance.

The process wherein the steps 3, 1 and 2 are conducted in this order is described in detail with reference to FIG. 6.

The 3-1-2 mode production process comprises the steps of:

applying the protective film forming layer 2 of the sheet 10 to form a protective film for chips onto the back surface of the semiconductor wafer 3 having circuits on its surface;

dicing the semiconductor wafer 3 together with the protective film forming layer 2 with respect to each circuit;

detaching the release sheet 1 from the protective film forming layer 2; and curing the protective film forming layer 2 by heating or energy ray irradiation to obtain semiconductor chips having the protective film on its back surface.

As shown in FIGS. 6-A to 6-C, this mode enables the dicing of the wafer 3 fixed on the protective film forming layer 2. In this case, the sheet 10 to form a protective film for chips has a function to act as a so-called dicing sheet. However, when the chip is mounted on a substrate for chips, the protective film forming layer has been already cured, losing the ability to act as a die bonding. Accordingly, the sheet employed in the process for producing semiconductor chips of the invention can not be used as a dicing/die-bonding sheet.

The sheet 10 to form a protective film for chips fixing the wafer 3 on its protective film forming layer 2 can be fixed on a dicing sheet, as shown in FIGS. 6-D to 6-F, to go through the above procedures.

According to the present invention, a highly uniform protective film can be readily formed on a back surface of chip.

The process wherein the steps 3, 2 and 1 are conducted in this order is described in detail with reference to FIG. 7.

The 3-2-1 mode production process comprises the steps of:

applying the protective film forming layer 2 of the sheet 10 to form a protective film for chips onto the back surface of the semiconductor wafer 3 having circuits on its surface;

dicing the semiconductor wafer 3 together with the protective film forming layer 2 with respect to each circuit;

curing the protective film forming layer 2 by heating or energy ray irradiation; and detaching the release sheet 1 from the cured protective film forming layer 2 to obtain semiconductor chips having the protective film on its back surface.

That is, the 3-2-1 mode production process is identical to the 3-1-2 mode production process (FIG. 6), except that the release sheet 1 is detached from the protective film forming layer 2 after the protective film forming layer 2 is cured.

As is mentioned earlier, the steps 1 to 3 can be performed in an arbitrary order without limitations in the first production process. Preferably, they are performed in the order of 1-2-3, 2-1-3, 3-1-2 or 3-2-1.

FIGS. 2 to 7 illustrate the case where the curing for the protective film forming layer is conducted by the use of a heating apparatus. When the energy ray-curable component is used as the curable component, the curing is performed using an energy ray irradiation equipment (ultraviolet ray irradiation equipment when ultraviolet ray being the energy ray).

In the case where the second sheet to form a protective film for chips is used, the protective film forming layer comprising both the thermosetting component and the energy ray-curable component as the curable component, is cured by heating and energy ray irradiation, which can be performed simultaneously or successively. Preferably, the protective film forming layer formed on a back surface of the wafer is first half cured by energy ray irradiation and then completely by heating to make a protective film.

The second process for producing semiconductor chips having a protective film on the back surface comprises:

adhering a protective film forming layer of the second sheet to form a protective film for chips according to the present invention onto a back surface of a semiconductor wafer having circuits on its surface, curing the protective film forming layer by irradiation with energy ray, and thereafter, further conducting the following steps 1 to 3 in an arbitrary order:

Step 1: detaching the release sheet from the protective film forming layer;

Step 2: further curing the protective film forming layer by heating;

Step 3: dicing the semiconductor wafer together with the protective film forming layer with respect to each circuit.

The steps 1 to 3 can be performed in an arbitrary order without limitations in the second production process likewise in the first production process. Preferably, they are performed in the order of 1-2-3, 2-1-3, 3-1-2 or 3-2-1.

When the protective film forming layer is cured by energy ray irradiation, the protective film forming layer loses tackiness and never sticks to other members even by the contact with other members under the usual storage conditions. Therefore, the series of the steps can be securely carried out to thereby improve the workability.

According to the present invention, a highly uniform protective film can be readily formed on a back surface of chip, and, even if minute scratches are formed on the back surface of chip as a result of mechanical grinding, the chip is prevailed over adverse effects resulting from the scratches.

EXAMPLES

The present invention is described in detail with reference to the examples., which are not to limit the scopes of the invention in any way. The composition of the protective film forming layer, the wafer and the apparatuses used in the examples are shown below.

Protective Film Forming Layer 1

The protective film forming layer 1 was composed of a composition comprising:

15 parts by weight of a binder polymer composed of an acrylic polymer (a copolymer composed of 55 parts by weight of butyl acrylate, 15 parts by weight of methyl methacrylate, 20 parts by weight of glycidyl methacrylate and 15 parts by weight of 2-hydroxyethyl acrylate, and having a weight average molecular weight of 900,000 and a glass transition temperature of −28° C.), 80 parts by weight of a thermosetting component composed of a mixed epoxy resin (30 parts by weight of a liquid epoxy-bisphenol A resin (epoxy equivalent: 180 to 200), 40 parts by weight of a solid epoxy-bisphenol A resin (epoxy equivalent: 800 to 900) and 10 parts by weight of an epoxy-o-cresol novolak resin (epoxy equivalent: 210 to 230), 0.6 part by weight of a heat-activatable latent epoxy resin curing agent (amine adduct type), 1.3 parts by weight of a black pigment (azo type), and a diluent solvent.

Protective Film Forming Layer 2

The protective film forming layer 2 was composed of a composition comprising, in addition to the composition for the protective film forming layer 1:

15 parts by weight of an energy ray (ultraviolet ray) curable component (trimethylolpropane triacrylate) and 4.5 parts by weight of a photopolymerization initiator (α-hydroxycyclohexylphenylketone).

Protective Film Forming Layer 3

The protective film forming layer 3 was composed of a composition comprising:

100 parts by weight of a binder polymer composed of an acrylic polymer (a copolymer composed of 65 parts by weight of butyl acrylate, 10 parts by weight of methyl methacrylate, 10 parts by weight of methyl acrylate and 15 parts by weight of 2-hydroxyethyl acrylate, and having a weight average molecular weight of 800,000 and a glass transition temperature of −33° C.), 50 parts by weight of an energy ray (ultraviolet ray) curable component (trimethylolpropane triacrylate), 1.5 parts by weight of a photocurable component (α-hydroxycyclohexylphenylketone), 0.5 part by weight of a crosslinking agent (organic polyvalent isocyanato-based crosslinking agent (Coronate L, Nippon Polyurethane Industry Co., Ltd.)), and a diluent solvent.

Wafer

An unground wafer having a diameter of six inches was ground to a thickness of 200 μm using a grinding apparatus (Disco Co., DFG-840) at #2000 abrasion to prepare the wafer for the examples.

Sheet Applying Apparatus
    Adwill RAD3500m/12 (Lintec Co., Ltd.)

Sheet Detaching Apparatus
    Adwill RAD3000m/12 (Lintec Co., Ltd.)

Dicing Tape Mounter
    Adwill RAD2500m/8 (Lintec Co., Ltd.)

Ultraviolet Ray Irradiation Apparatus
    Adwill RAD2000m/8 (Lintec Co., Ltd.)

Dicing Apparatus
    AWD-4000B (Tokyo Seimitsu Co., Ltd.)

Forced Convection Constant Temperature Oven
    DN610 (Yamato Scientific Co., Ltd.)

Dicing Sheet
    Adwill G-11 (Lintec Co., Ltd.)

Example 1

A polyethyleneterephthalate film (Lintec Co., Ltd. SP-PET3811, thickness: 38 μm, surface tension: less than 30 mN/m) having been treated for releasing at one surface was used as a release sheet. The composition for the protective film forming layer 1 was coated on the release-treated surface of the release sheet so as to have a thickness of 30 μm after the solvent being removed by drying, thereby a sheet to form a protective film for chips was prepared. For protection of the coated surface, a release-treated polyethyleneterephthalate film (Lintec Co., Ltd. SP-PET3801) was laminated thereon.

The polyethyleneterephthalate film (SP-PET3801) was detached from the sheet to form a protective film for chips. The protective film forming layer was applied onto the ground surface of the wafer using the sheet applying apparatus. The peripheral edge of the sheet was removed along the wafer shape (FIG. 2-A). The release sheet was detached using the sheet detaching apparatus (FIG. 2-B). The protective film forming layer was cured by heating at 160° C. for 1 hour using the forced convection constant temperature oven (FIG. 2-C) to prepare a wafer having a protective film.

A dicing sheet was applied on the protective film of the wafer using the dicing tape mounter. The wafer, together with the protective film, was diced into chips (10 mm×10 mm) by the use of the dicing apparatus to obtain objective chips having a protective film (FIGS. 2-D and 2-E).

Example 2

A polyethylenenaphthalate film (Teijin Ltd, Teonex, thickness: 25 μm, surface tension: less than 30 mN/m) having been treated for releasing at one surface was used as a release sheet. The composition for the protective film forming layer 1 was coated on the release-treated surface of the release sheet so as to have a thickness of 30 μm after the solvent being removed by drying, thereby a sheet to form a protective film for chips was prepared. For protection of the coated surface, a release-treated polyethyleneterephthalate film (Lintec Co., Ltd. SP-PET3801) was laminated thereon.

The polyethyleneterephthalate film was detached from the sheet to form a protective film for chips. The sheet was applied on the ground surface of the wafer in the same manner as in Example 1. The peripheral edge of the sheet was removed along the wafer shape (FIG. 4-A).

The protective film forming layer was cured by heating at 160° C. for 1 hour using the forced convection constant temperature oven (FIG. 4-B) to form a protective film on the ground surface of the wafer.

The release sheet was detached using the sheet detaching apparatus (FIG. 4-C). A dicing sheet was applied on the protective film of the wafer using the dicing tape mounter. The wafer, together with the protective film, was diced into chips (10 mm×10 mm) by the use of the dicing apparatus to obtain objective chips having a protective film (FIGS. 4-D and 4-E).

Example 3

A polyethyleneterephthalate film (Lintec Co., Ltd. SP-PET3811) having been treated for releasing at one side was used as a release sheet. The composition for the protective film forming layer 3 was coated on the release-treated surface of the release sheet so as to have a thickness of 30 μm after the solvent being removed by drying, thereby a sheet to form a protective film for chips was prepared. For protection of the coated surface, a release-treated polyethyleneterephthalate film (Lintec Co., SP-PET3801) was laminated thereon.

The polyethyleneterephthalate film (SP-PET3801) was detached from the sheet to form a protective film for chips.

The sheet was applied on the ground surface of the wafer in the same manner as in Example 1. The peripheral edge of the sheet was removed along the wafer shape (FIG. 4-A).

The protective film forming layer was completely cured by ultraviolet ray irradiation dosed from the sheet side using the ultraviolet ray irradiation apparatus, thereby a wafer having a protective film was obtained (not shown in the figure).

The release sheet was detached using the sheet detaching apparatus (FIG. 4-C). A dicing sheet was applied on the protective film of the wafer using the dicing tape mounter. The wafer, together with the protective film, was diced into chips (10 mm×10 mm) using the dicing apparatus to obtain objective chips having a protective film (FIGS. 4-D and 4-E).

Example 4

The composition for the protective film forming layer 2 was coated on the release-treated surface of a polyethyleneterephthalate film (Lintec Co., Ltd. SP-PET3801) having been treated for releasing at one surface so as to have a thickness of 50 μm after the solvent being removed by drying. As a release sheet, a linear low-density polyethylene film (thickness: 110 μm, surface tension: 32 mN/m) was applied onto the coated surface, thereby a sheet to form a protective film for chips was prepared.

The protective film forming layer of the sheet to form a protective film for chips, was applied on the ground surface of the wafer using the dicing tape mounter, and a laminate thus formed was fixed by a ring frame (FIG. 6-A).

The protective film forming layer was half cured by ultraviolet ray irradiation dosed from the sheet side using the ultraviolet ray irradiation apparatus (not shown in the figure).

The wafer, together with the protective film, was diced into chips (10 mm×10 mm) using the dicing apparatus to obtain objective chips having a protective film forming layer (FIGS. 6-B and 6-C).

The respective chips were heated at 160° C. for 1 hour using the forced convection constant temperature oven (FIG. 6-G) to cure the protective film forming layer, thereby objective chips having a protective film were obtained.

Example 5

The composition for the protective film forming layer 2 was coated on the release-treated surface of a polyethyleneterephthalate film (Lintec Co., Ltd. SP-PET3801) having been treated for releasing at one surface so as to have a thickness of 30 μm after the solvent being removed by drying. As a release sheet, a linear low-density polyethylene film (thickness: 110 μm, surface tension: 32 mN/m) was applied onto the coated surface, thereby a sheet to form a protective film for chips was prepared.

The polyethyleneterephthalate film was detached from the sheet to form a protective film for chips. The protective film forming layer was applied on the ground surface of the wafer in the same manner as in Example 1, and the peripheral edge of the sheet was removed along the wafer shape (FIG. 2-A).

The protective film forming layer was half cured by ultraviolet ray irradiation dosed from the sheet side using the ultraviolet ray irradiation apparatus to eliminate its tackiness (not shown in the figure).

After the release sheet was detached using the sheet detaching apparatus (FIG. 2-B), the protective film forming layer was completely cured by heating at 160° C. for 1 hour using the forced convection constant temperature oven (FIG. 2-C) to prepare a wafer having a protective film.

The wafer, together with the protective film, was diced into chips (10 mm×10 mm) in the same manner as in Example 1 to obtain objective chips having a protective film (FIGS. 2-D and 2-E).

What is claimed is:

1. A sheet to form a protective film for chips which are mounted face down, consisting of a release sheet and a protective film forming layer formed on a detachable surface of the release sheet, wherein said protective film forming layer comprises a thermosetting component and a binder polymer component.

2. The sheet to form a protective film for chips according to claim 1, wherein the binder polymer component is composed of an acrylic polymer.

3. The sheet to form a protective film for chips according to claim 1, wherein the thermosetting component is composed of an epoxy resin.

4. The sheet to form a protective film for chips according to claim 1, wherein the protective film forming layer is colored.

5. The sheet to form a protective film for chips according to claim 1, wherein the protective film forming layer further comprises a black pigment.

* * * * *